United States Patent
Khazeni et al.

(10) Patent No.: US 6,423,384 B1
(45) Date of Patent: *Jul. 23, 2002

(54) HDP-CVD DEPOSITION OF LOW DIELECTRIC CONSTANT AMORPHOUS CARBON FILM

(75) Inventors: Kasra Khazeni, San Jose; Eugene Tzou, Sunnyvale; Zhengquan Tan, Cupertino, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/339,888

(22) Filed: Jun. 25, 1999

(51) Int. Cl.$^7$ ................................................. H05H 1/24
(52) U.S. Cl. ..................... 427/577; 427/162; 427/249.7; 427/376.1
(58) Field of Search .............................. 427/577, 249.1, 427/249.7, 376.1, 162

(56) References Cited

U.S. PATENT DOCUMENTS

| | | |
|---|---|---|
| 3,510,369 A | 5/1970 | Ernick et al. |
| 4,262,631 A | 4/1981 | Kubacki |
| 4,486,286 A | 12/1984 | Lewin et al. |
| 4,532,150 A | 7/1985 | Endo et al. |
| 4,634,601 A | 1/1987 | Hamakawa et al. |

(List continued on next page.)

FOREIGN PATENT DOCUMENTS

EP 0 613 178 A2 8/1994
EP 0 725 440 A2 8/1996
WO 99/33102 7/1999

OTHER PUBLICATIONS

Ogawa et al., "Novel ARC Optimization Methodology for KrF Excimer Laser Lithography at Low K1 Factor," *Proceedings of the SPIE. Optical/Laser Microlithography V*, vol. 1674, 1992, pp. 362–375.

Dijkstra et al., "Optimization of Anti–Reflection Layers for Deep UV Lithography," *Proceedings of SPIE Optical/Laser Microlithography, Bellingham, SPIE*, vol. 1927, pp. 275–286, 1993.

Grill, et al., "Low dielectric constant films prepared by plasma–enhanced chemical vapor deposition from tetramethylsilane", vol. 85 *J. Applied Phys.* No. 6 (Mar. 15, 1999), pp. 3314–3318.

Grill, et al., "Novel Low k Dielectrics Based on Diamond–like Carbon Materials", J. Electrochem. Soc., vol. 145, No. 5, May 1988, pp. 1649–1653.

*Primary Examiner*—Bret Chen
(74) *Attorney, Agent, or Firm*—Moser, Patterson & Sheridan

(57) ABSTRACT

The present invention generally provides a method for depositing a low dielectric constant amorphous carbon film on a substrate or other workpiece using high density plasma chemical vapor deposition (HDP-CVD) techniques. Specifically, the present invention provides a method for forming an amorphous carbon film having a low dielectric constant of less than about 3.0 and a high thermal stability at a temperature of at least about 400° C. In a preferred embodiment, the film is deposited using methane ($CH_4$) and argon in a HDP-CVD reactor. The amorphous carbon film formed according to the invention is useful for many applications in ultra large scale integration (ULSI) structures and devices, such as for example, an inter-metal dielectric material and an anti-reflective coating useful for patterning sub-micron interconnect features.

11 Claims, 7 Drawing Sheets

U.S. PATENT DOCUMENTS

| | | | |
|---|---|---|---|
| 4,717,622 A | | 1/1988 | Kurokawa et al. |
| 4,759,947 A | | 7/1988 | Ishihara et al. |
| 4,892,751 A | * | 1/1990 | Miyake et al. ............... 427/572 |
| 4,895,734 A | | 1/1990 | Yoshida et al. |
| 4,951,601 A | | 8/1990 | Maydan et al. |
| 5,086,014 A | | 2/1992 | Miyata et al. |
| 5,238,866 A | | 8/1993 | Bolz et al. |
| 5,360,491 A | | 11/1994 | Carey et al. |
| 5,397,558 A | * | 3/1995 | Miyanaga et al. .......... 423/446 |
| 5,401,613 A | | 3/1995 | Brewer et al. |
| 5,465,680 A | | 11/1995 | Loboda |
| 5,468,978 A | | 11/1995 | Dowben |
| 5,470,661 A | | 11/1995 | Bailey et al. |
| 5,480,300 A | | 1/1996 | Okoshi et al. |
| 5,565,084 A | | 10/1996 | Lee et al. |
| 5,591,566 A | | 1/1997 | Ogawa |
| 5,641,607 A | | 6/1997 | Ogawa et al. |
| 5,658,834 A | | 8/1997 | Dowben |
| 5,691,010 A | * | 11/1997 | Kuramoto et al. .......... 427/577 |
| 5,691,209 A | | 11/1997 | Liberkowski |
| 5,710,067 A | | 1/1998 | Foote et al. |
| 5,711,987 A | | 1/1998 | Bearinger et al. |
| 5,720,808 A | * | 2/1998 | Hirabayashi et al. ....... 117/103 |
| 5,730,792 A | | 3/1998 | Camilletti et al. |
| 5,741,626 A | | 4/1998 | Jain et al. |
| 5,776,235 A | | 7/1998 | Camilletti et al. |
| 5,780,163 A | | 7/1998 | Camilletti et al. |
| 5,789,316 A | | 8/1998 | Lu |
| 5,789,776 A | | 8/1998 | Lancaster et al. |
| 5,804,259 A | * | 9/1998 | Robles ........................ 427/577 |
| 5,817,579 A | | 10/1998 | Ko et al. |
| 5,818,071 A | | 10/1998 | Loboda et al. |
| 5,869,396 A | | 2/1999 | Pan et al. |
| 5,876,891 A | | 3/1999 | Takimoto et al. |
| 5,942,328 A | * | 8/1999 | Grill et al. ................... 428/408 |
| 6,020,458 A | * | 2/2000 | Lee et al. .................... 528/401 |
| 6,033,979 A | * | 3/2000 | Endo ........................... 438/622 |
| 6,043,167 A | * | 3/2000 | Lee et al. .................... 438/789 |
| 6,143,670 A | * | 11/2000 | Cheng et al. ................ 438/780 |
| 6,147,009 A | | 11/2000 | Grill et al. |
| 6,147,407 A | * | 11/2000 | Jin et al. ..................... 257/758 |

* cited by examiner

HDP-CVD DEPOSITION OF LOW DIELECTRIC CONSTANT AMORPHOUS CARBON FILM

BACKGROUND OF THE INVENTION

1. Field of the Invention

The present invention generally relates to an apparatus and a method for depositing a low dielectric constant film. More particularly, the present invention relates to an apparatus and a method for depositing a low dielectric constant amorphous hydrogenated carbon film utilizing high density plasma chemical vapor deposition (HDP-CVD).

2. Background of the Related Art

Consistent and fairly predictable improvement in integrated circuit design and fabrication has been observed in the last decade. Recent increases in ultra large scale integration (ULSI) and the corresponding decreases in the dimensions of the electrical devices have increased the inter-level and the intra-level capacitances which in tun cause an increase in signal delays that hinder the performance of the devices. With newer ULSI operation frequencies approaching 1 GHz and interconnect feature sizes decreasing to less than 250 nanometers, the interconnect resistance-capacitance (RC) delay becomes a major determinant to the speed of the integrated circuits. Significantly new and different manufacturing approaches will be required to achieve the required performance and speed goals. Since RC delay is directly related to the interconnect resistance and dielectric capacitance, the industry focus is on developing new materials with significantly lower dielectric constants and lower resistivities.

In the area of dielectrics, a great variety of materials are being investigated as potential replacements for the current standard silicon dioxide ($SiO_2$). In order to improve the performance of the new ULSI circuits, insulating materials having dielectric constants (k) significantly lower than that of the silicon dioxide (k≈4) are needed to reduce the RC delay and cross talk. It is well accepted that a dielectric constant of less than 3.0 will be required for the next generation of sub-micron devices in order to meet the expected performance requirements.

A great variety of materials with low dielectric constants are being investigated as potential candidates to replace $SiO_2$. However, it is important to remember that the dielectric constant is only one of many critical requirements that must be met. Ease of integration into existing and future process fabrication flows and economic factors (e.g., cost of ownership) will together decide the viability of a material for use as the next generation intermetal dielectric (IMD). Integration capability will be determined by critical properties such as adhesion, thermal stability, thermal conductivity, mechanical strength and gap fill performance. Cost of ownership will be determined by cost of the raw materials, cost of processing waste material (which has been found to be especially high with spin-on techniques), the number of required integration steps as well as the capital cost of the processing equipment. The ideal low dielectric constant material will easily integrate into existing process flows, utilize existing equipment, and cost no more than currently used processes.

Chemical vapor deposition (CVD) appears to be the most promising approach to form low dielectric constant materials. It is well accepted that the mechanisms in plasma assisted depositions will lead to materials with significantly higher density and mechanical strength than other types of deposition techniques. In addition, integration of a CVD film is well characterized and fairly simple to implement as compared to wet processes such as spin-on methods. The potential of using existing plasma enhanced CVD equipment and simple manufacturing methodology makes CVD materials attractive from both an integration and an economic standpoint.

Among the CVD-deposited materials, hydrogenated amorphous carbon (α-C:H) films, also called diamond-like carbon (DLC) films, have shown great potential for applications as low dielectric constant materials used in structures and devices in ultra large scale integration (ULSI). However, integration of the dielectric material into ULSI circuits requires thermal stability of the dielectric material at temperatures of at least about 400° C. Similar to other low dielectric constant materials, such as polytetrafluoroethylene (PTFE) with k≈2.0, hydrogenated amorphous carbon films have been found to be unstable at temperatures above about 350° C. and have failed to retain their low dielectric constant property. The hydrogenated amorphous carbon films that have been found to exhibit high thermal stability at temperatures greater than about 350° C. typically possess dielectric constants of about 6.0, which is unacceptable for use in ULSI circuits.

An alternative to the hydrogenated amorphous carbon films incorporates fluorine into a DLC film. One such fluorinated DLC film has been described by A. Grill, V. Patel and C. Jahnes, in "Novel Low k Dielectric Based on Diamondlike Carbon Materials," J. Electrochem. Soc., Vol. 145, No. 5, May 1998. However, the incorporation of fluorine during the film formation complicates the deposition process. One problem associated with the fluorinated DLC films is that organic fluorocarbon molecules will either form etching species or polymerize under glow discharge conditions. Whether the etching species formation or the polymerization reaction dominates depends on the plasma energy, the charged specie intensities, the reactant ratios and the surface temperatures. In either case, the material properties of the resulting film are degraded by these reactions. Another problem encountered is that fluorine generated during deposition of the fluorinated DLC may be absorbed by the chamber walls and chamber components. The fluorine incorporated into the surface of the chamber walls and chamber components increases the chamber cleaning time. The prolonged cleaning time results in a decrease in throughput of the processing system.

The sub-micron interconnect features in the next generation of ULSI integrated circuits also demand precisely patterned photoresist to properly etch the structures of the interconnect features into a dielectric film, such as an intermetal dielectric layer. Generally, to form an interconnect feature in a dielectric film on a substrate, a photoresist is applied over the surface of the dielectric film and patterned using a light source, preferably a light source using ultraviolet (UV) wavelengths. Typically, the UV light source uses wavelengths of about 193 nm or about 248 nm to pattern the photoresist for sub-micron features. After the photoresist has been patterned, the substrate is etched using commonly known etching techniques to form the interconnect structures in the dielectric film.

An anti-reflective coating (ARC) is typically deposited on the dielectric film prior to the application of the photoresist. The ARC film reduces the reflections of the UV light source during the patterning process to provide sharper definitions to the patterns on the photoresist. However, currently practiced ARC films do not provide adequate anti-reflective properties for the 193 nm and 248 nm UV wavelengths. The patterns on the photoresist are distorted by the reflections of the UV light from the substrate surface, particularly reflection from the metal deposited on the substrate, resulting in poorly defined interconnect features after the etch process. Poorly defined interconnect features leads to improper and defective device formation on the substrate.

Therefore, there is a need for a method of forming a hydrogenated amorphous carbon film that is useful in the fabrication of ULSI circuits. It would be preferable for the hydrogenated amorphous carbon film to possess a dielectric constant less than about 3.0 as well as exhibit high thermal stability at temperatures greater than about 400° C. It would be further desirable for the hydrogenated amorphous carbon film to provide low reflectance to UV light, particularly for the 193 nm and 248 nm UV wavelengths useful for patterning sub-micron interconnect features.

SUMMARY OF THE INVENTION

The present invention generally provides a method for depositing a low dielectric constant hydrogenated amorphous carbon film on a substrate or other workpiece using high density plasma chemical vapor deposition (HDP-CVD) techniques. Specifically, the present invention provides a method for forming a low dielectric constant hydrogenated amorphous carbon film having a dielectric constant of less than about 3.0 and a high thermal stability at a temperature of about 400° C. or higher that is useful in the fabrication of ULSI circuits.

In one aspect of the invention, the method generally comprises positioning the substrate in a high density plasma chemical vapor deposition chamber, introducing a processing gas comprising a hydrocarbon gas and argon into the chamber, and generating a high density plasma of the processing gases to cause deposition on the substrate. Preferably, during the deposition process, the chamber pressure is maintained at between about 10 mT and about 100 mT, and the source RF power is applied at between about 1000 W and about 2000 W (for a 200 mm substrate) to the chamber. The substrate having the deposited carbon film thereon is then annealed at between about 300° C. and about 430° C. for between about 30 minutes and about 90 minutes in a vacuum environment or in an inert gas environment.

In a preferred embodiment, the film is deposited using methane ($CH_4$) and argon in a HDP-CVD reactor. The resulting low dielectric constant amorphous carbon film is thermally stable at temperatures of at least about 400° C. and has a dielectric constant (k) of about 2.53. The amorphous carbon film formed according to the invention is useful for many applications in ultra large scale integration (ULSI) structures and devices, such as an inter-metal dielectric material. The amorphous carbon film formed according to the invention is also particularly useful as an anti-reflective coating to provide low reflectance to UV light, particularly for the 193 nm and 248 nm UV wavelengths useful for patterning sub-micron interconnect features.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention provides a method of depositing a low dielectric constant amorphous carbon film on a substrate or other workpiece using high density plasma chemical vapor deposition (HDP-CVD) techniques. Specifically, the present invention provides a method of forming a low dielectric constant amorphous carbon film having a low dielectric constant of less than about 3.0 and a high thermal stability of at least about 400° C. In a preferred embodiment, the film is deposited using methane ($CH_4$) and argon in a HDP-CVD reactor.

The methods of the present invention are preferably performed using an Ultima™ HDP-CVD chamber on a Centura® System available from Applied Materials, Inc. located in Santa Clara, Calif. The features of the system are generally described below. It is to be understood that while the below described HDP-CVD system is the best system known to the inventors, other systems, may also be used, or modified to be used, to advantage to accomplish the methods of the present invention.

Figure 1A:
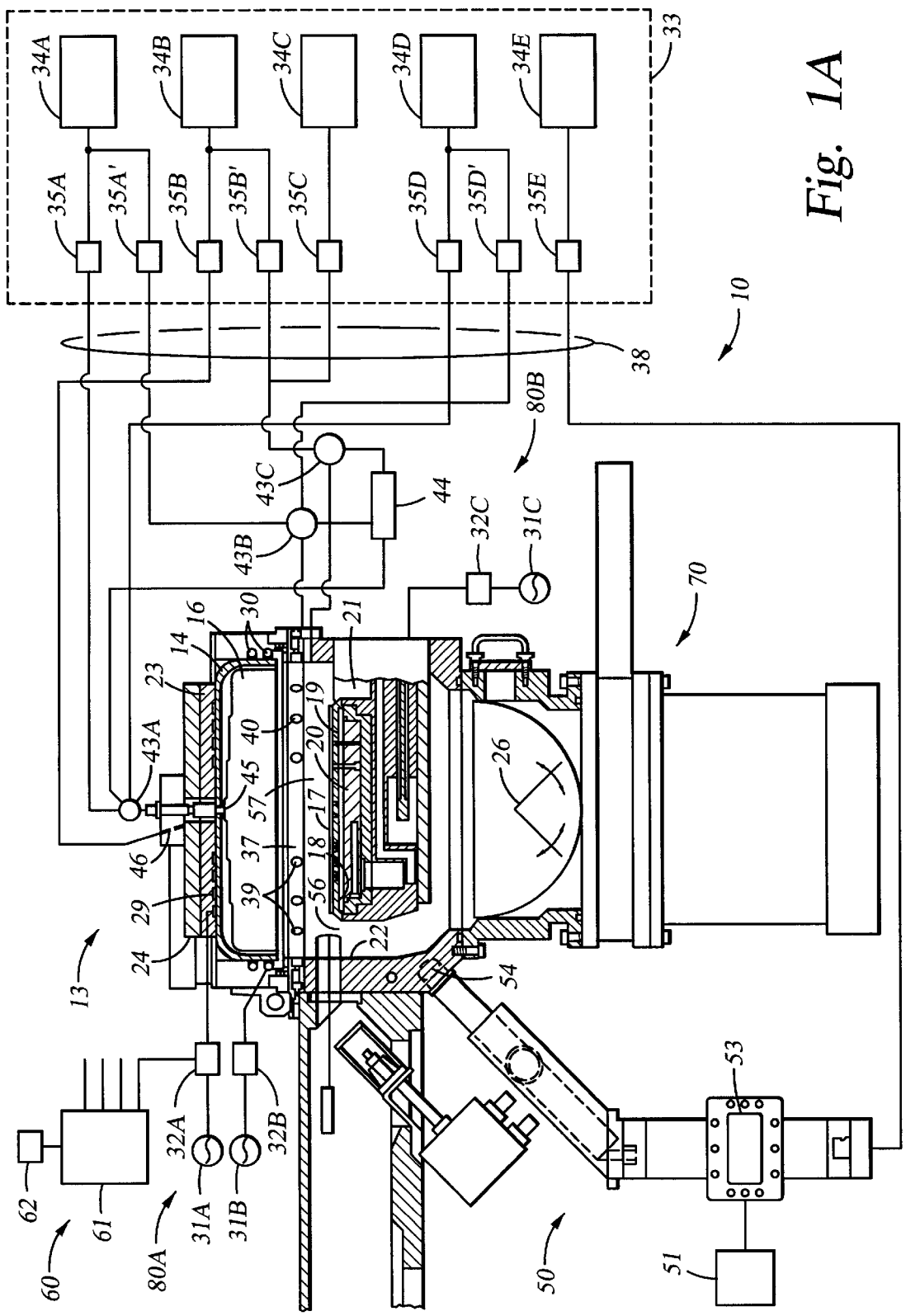
FIG. 1A is a simplified diagram of one embodiment of a high density plasma chemical vapor deposition system useful for the present invention.

FIG. 1A illustrates one embodiment of a HDP-CVD system 10 useful for depositing a dielectric film according to the present invention. The HDP-CVD system 10 includes a chamber 13, a vacuum system 70, a source plasma system 80A, a bias plasma system 80B, a gas delivery system 33, and a remote plasma cleaning system 50.

The upper portion of chamber 13 includes a dome 14, preferably made of a dielectric material, such as alumina or aluminum nitride. The dome 14 defines an upper boundary of a plasma processing region 16. The plasma processing region 16 has a lower boundary defined by an upper surface of a substrate 17 positioned on a substrate support member 18.

A heater plate 23 and a cold plate 24 are thermally coupled to the dome 14. Preferably, the heater plate 23 and the cold plate 24 allow control of the dome temperature to within about ±10° C. over a range of about 100° C. to 200° C.

The lower portion of chamber 13 includes a body member 22, which joins the chamber to the vacuum system 70. The vacuum system 70 is connected to the body member 22 through a throttle valve 26. A base portion 21 of substrate support member 18 is mounted on, and forms a continuous inner surface with, body member 22. Substrates are transferred into and out of chamber 13 at an upper loading position 57 and moved to a lower processing position 56 in which the substrate is placed on a substrate receiving portion 19 of substrate support member 18. Substrate receiving portion 19 includes an electrostatic chuck 20 that secures the substrate to substrate support member 18 during substrate processing.

The source plasma system 80A includes a top coil 29 and side coil 30, mounted on dome 14. A symmetrical ground shield (not shown) reduces electrical coupling between the coils. The top coil 29 is powered by a top source RF (SRF) generator 31A, while the side coil 30 is powered by a side SRF generator 31B, allowing independent power levels and frequencies of operation for each coil. This dual coil system allows control of the radiation density in chamber 13, thereby improving plasma uniformity. Side coil 30 and top coil 29 are typically inductively driven, which does not require a complimentary electrode. In a specific embodiment, the top source RF generator 31A provides up to 2,500 watts of RF power at nominally 2 MHz and the side source RF generator 31B provides up to 5,000 watts of RF power at nominally 2 MHz. The operating frequencies of the top and side RF generators may be offset from the nominal operating frequency (e.g., to 1.7–1.9 MHz and 1.9–2.1 MHz, respectively) to improve plasma-generation efficiency.

Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a comatch, and effectively disable the RF control circuit from tuning the matching network, is to set the reflected power limit above any expected value of reflected power. This may help stabilize a plasma under some conditions by holding the matching network constant at its most recent condition.

A bias plasma system 80B includes a bias RF (BRF) generator 31C and a bias matching network 32C. The bias plasma system 80B capacitively couples substrate portion 17 to body member 22, which act as complimentary electrodes. The bias plasma system 80B serves to enhance the transport of plasma species (i.e., ions) created by the source plasma system 80A to the surface of the substrate. In a specific embodiment, bias RF generator provides up to 5,000 watts of RF power at 13.56 MHz.

A gas delivery system 33 provides gases from several sources to the chamber for processing the substrate via gas delivery lines 38 (only some of which are shown).

Figure 1B:
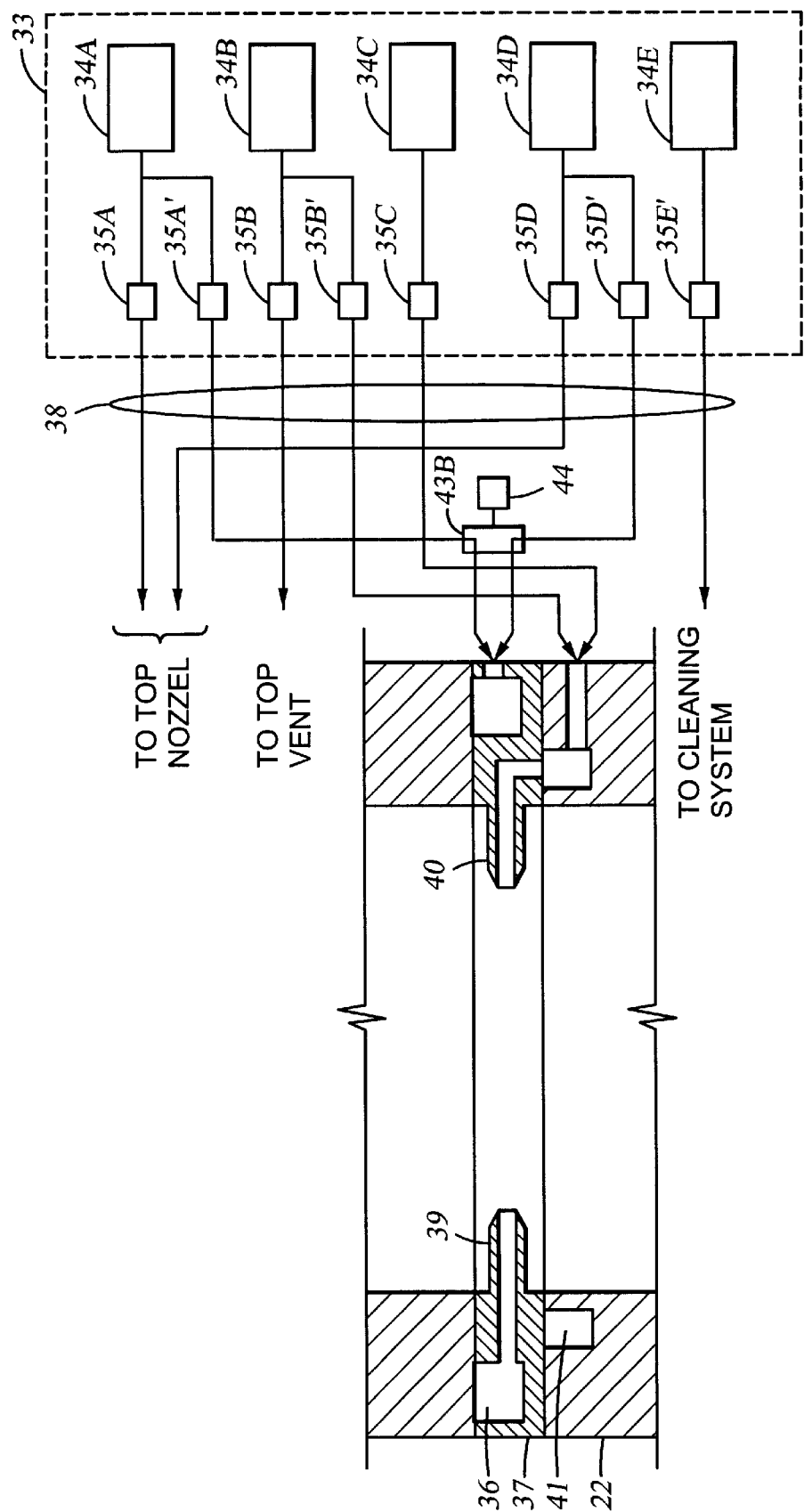
FIG. 1B is a simplified cross section of a gas ring that may be used in conjunction with the exemplary CVD processing chamber of FIG. 1A.

Gases are introduced into chamber 13 through a gas ring 37 and a top nozzle 45. FIG. 1B is a simplified, partial cross-sectional view of chamber 13 showing additional details of the gas ring 37. In one embodiment, first and second gas sources, 34A and 34D, and first and second gas mass flow controllers, 35A' and 35D', provide gas to a ring plenum 36 in gas ring 37 via gas delivery lines 38 (only some of which are shown). Gas ring 37 has a first plurality of source gas nozzles 39 (only one of which is shown in FIG. 1B), preferably evenly distributed along the inner surface of the gas ring 37, that provide a uniform flow of gas over the substrate during processing.

The gas ring 37 also includes a second plurality of gas nozzles 40 (only one of which is shown), which receive gas from a body plenum 41. In one embodiment, a third and a fourth gas sources, 34B and 34C, and a third and a fourth gas flow controllers, 35B' and 35C, provide gases to the body plenum 41 via gas delivery lines 38. In a preferred embodiment, the second plurality of source gas nozzles 40 are co-planar with, and preferably shorter than the first plurality of source gas nozzles 39. In some embodiments, it is desirable not to mix source gases and oxidizer gases before injecting the gases into chamber 13. In other embodiments, the source gases may be mixed prior to injecting the gases into chamber 13.

The nozzle length and the nozzle angle may be changed to allow tailoring of the uniformity profile and gas utilization efficiency for a particular process within an individual chamber. In a preferred embodiment, the gas ring 37 provides twelve source gas nozzles (preferably six nozzles 39 and six nozzles 40 in an alternating arrangement) evenly positioned around the inner circumference of the gas ring 37.

Referring again to FIG. 1A, chamber 13 also has top nozzle 45 and top vent 46. Top nozzle 45 and top vent 46 allow independent control of top and side flows of the gases, which improves film uniformity and allows fine adjustment of the film's deposition. Top vent 46 is an annular opening around top nozzle 45. In one embodiment, a first gas source 34A supplies a first gas to source gas nozzles 39 and top nozzle 45. Source nozzle mass flow controller (MFC) 35A' controls the amount of the first gas delivered to source gas nozzles 39, and a top nozzle MFC 35A controls the amount of the first gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed before they flow into chamber 13. Separate sources of the same gas may be used to supply various portions of the chamber.

A system controller 60 controls the operation of system 10. In a preferred embodiment, controller 60 includes a memory 62, such as a hard disk drive, a floppy disk drive (not shown), and a card rack (not shown). The card rack may contain a single-board computer (SBC) (not shown), analog and digital input/output boards (not shown), interface boards (not shown), and stepper motor controller boards (not shown). The system controller conforms to the Versa Modular European (VME) standard, which defines board, card cage, and connector dimensions and types. The VME standard also defines the bus structure having a 16-bit data bus and 24-bit address bus. System controller 60 operates under the control of a computer program stored on the hard disk drive or other computer programs, such as programs stored on a floppy disk. The computer program dictates, for example, the timing, mixture of gases, RF power levels and other parameters of a particular process. System controller 60 includes a processor 61 coupled to a memory 62. Preferably, memory 62 may be a hard disk drive, but of course memory 62 may be other kinds of memory, such as ROM, PROM, and others.

Figure 1C:
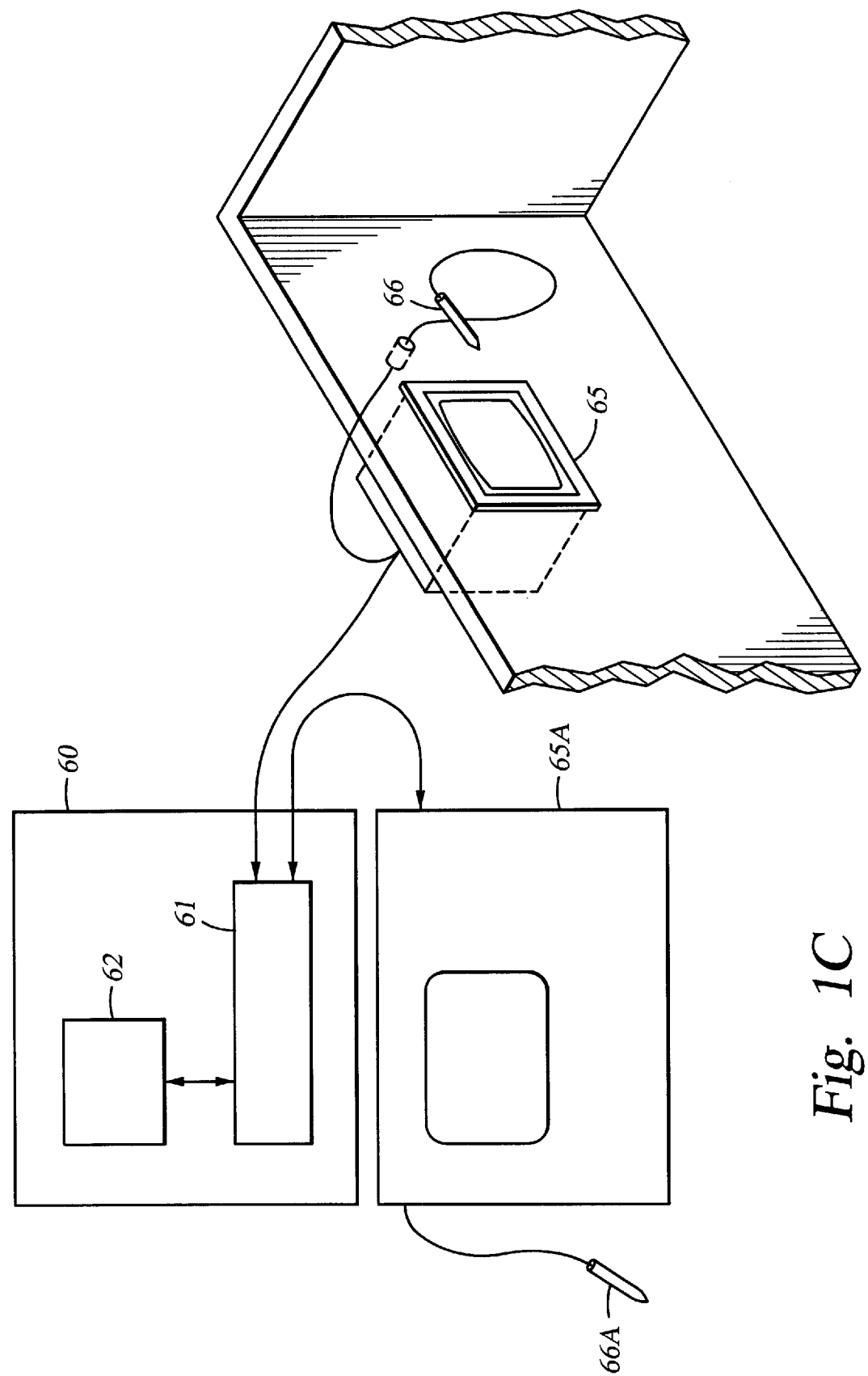
FIG. 1C is a simplified diagram of a monitor and light pen that may be used in conjunction with the exemplary CVD processing chamber of FIG. 1A.

The system controller 60 operates under the control of a computer program. The computer program dictates the timing, temperatures, gas flows, RF power levels and other parameters of a particular process. The interface between a user and the system controller is via a CRT monitor 65 and a light pen 66, as depicted in FIG. 1C. In a preferred embodiment, two monitors, 65 and 65A, are used, one mounted in the clean room wall for the operators and the other behind the wall for the service technicians. Both monitors simultaneously display the same information, but only one light pen (e.g., 66) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer readable programming language such as 68000 assembly language, C, C++, or Pascal. Suitable program code is entered into a single file, or multiple files, using a conventional text editor, and stored or embodied in a computer-usable medium, such as a memory system of the computer. If the entered code text is in a hi-h level language the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 1D:
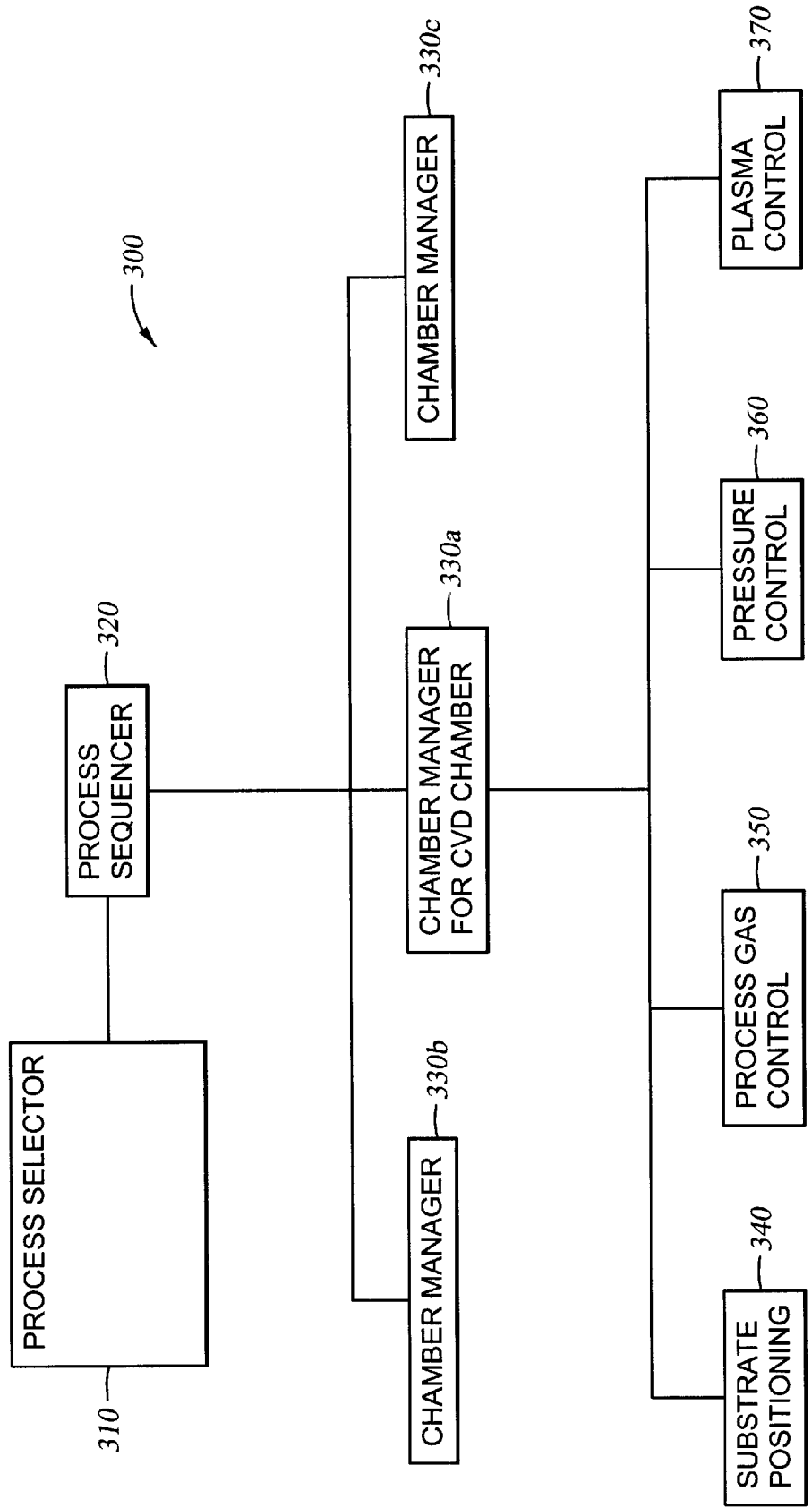
FIG. 1D is a flow chart of an exemplary process control computer program product used to control the exemplary CVD processing chamber of FIG. 1A.

FIG. 1D shows an illustrative block diagram of the hierarchical control structure of computer program 300. A user enters a process set number and process chamber number into a process selector subroutine 310 in response to menus or screens displayed on the CRT monitor by using the light pen interface. Tile process sets are predetermined sets of process parameters necessary to carry out specified processes, and are identified by predefined set numbers. Process selector subroutine 310 identifies (i) the desired process chamber in a multi-chamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog input and digital input boards of the system controller and the signals for controlling the process are output on the analog output and digital output boards of system controller 60.

A process sequencer subroutine 320 comprises program code for accepting the identified process chamber and set of process parameters from the process selector subroutine 310, and for controlling operation of the various process chambers. Multiple users can enter process set numbers and process chamber numbers, or a user can enter multiple process set numbers and process chamber numbers, so sequencer subroutine 320 operates to schedule the selected processes in the desired sequence. Preferably, sequencer subroutine 320 includes a program code to perform the steps of (i) monitoring the operation of the process chambers to determine if the chambers are being used, (ii) determining what processes are being carried out in the chambers being used, and (iii) executing the desired process; based on availability of a process chamber and type of process to be carried out. Conventional methods of monitoring the process chambers can be used, such as polling. When scheduling which process is to be executed, sequencer subroutine 320 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 320 determines which process chamber and process set combination is going to be executed next, sequencer subroutine 320 causes execution of the process set by passing the particular process set parameters to a chamber manager subroutine 330A–C, which controls multiple processing tasks in chamber 13 and possibly other chambers (not shown) according to tile process set determined by sequencer subroutine 320.

Examples of chamber component subroutines are substrate positioning subroutine 340, process gas control subroutine 350, pressure control subroutine 360, and plasma control subroutine 370. Those having ordinary skill in the art will recognize that other chamber control subroutines can be included depending on what processes are desired to be performed in chamber 13. In operation, chamber manager subroutine 330A selectively schedules or calls the process component subroutines in accordance with tile particular process set being executed. Scheduling by chamber manager subroutine 330A is performed in a manner similar to that used by sequencer subroutine 320 in scheduling which process chamber and process set to execute. Typically, chamber manager subroutine 330A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1D. Substrate positioning subroutine 340 comprises program code for controlling chamber components that are used to load a substrate onto substrate support number 18. Substrate positioning subroutine 340 may also control transfer of a substrate into chamber 13 from, e.g., a PECVD reactor or other reactor in the multi-chamber system, after other processing has been completed.

Process gas control subroutine 350 has program code for controlling process gas composition and flow rates. Subroutine 350 controls the open/close position of the safety shutoff valves, and also ramps up/down the mass flow controllers to obtain the desired gas flow rates. All chamber component subroutines, including process gas control subroutine 350, are invoked by chamber manager subroutine 330A. Subroutine 350 receives process parameters from chamber manager subroutine 330A related to the desired gas flow rates.

Typically, process gas control subroutine 350 operates by opening the gas supply lines, and repeatedly (i) reading the necessary mass flow controllers, (ii) comparing the readings to the desired flow rates received from chamber manager subroutine 330A, and (iii) adjusting the flow rates of the gas supply lines as necessary. Furthermore, process gas control subroutine 350 may include steps for monitoring the gas flow rates for unsafe rates, and activating the safety shut-off valves when an unsafe condition is detected.

In some processes, an inert gas, such as argon, is flowed into chamber 13 to stabilize the pressure in the chamber before reactive process gases are introduced into the chamber. For these processes, the process gas control subroutine 350 is programmed to include steps for flowing the inert gas into chamber 13 for an amount of time necessary to stabilize the pressure in the chamber before the above-described steps may then be carried out.

Furthermore, the process gas control subroutine 350 includes steps for obtaining the necessary delivery gas flow rate for the desired process gas flow rate by accessing a stored table containing the necessary values for a given process gas flow rate. Once the necessary values are obtained, the delivery gas flow rate is monitored, compared to the necessary values and adjusted accordingly.

The process gas control subroutine 350 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the helium cools the substrate through the chuck, which may also be water-cooled. This keeps the substrate below a temperature that may damage preexisting features on the substrate.

Pressure control subroutine 360 includes program code for controlling the pressure in chamber 13 by regulating the size of the opening of throttle valve in the exhaust portion of the chamber. There are at least two basic methods of controlling the chamber with the throttle valve. The first method relies on characterizing the chamber pressure as it relates to, among other things, the total process gas flow, size of the process chamber, and pumping capacity. The first method sets throttle valve 26 to a fixed position. Setting throttle valve 26 to a fixed position may eventually result in a steady-state pressure.

Alternatively, the chamber pressure may be measured, with a manometer, for example, and the throttle valve 26 position may be adjusted according to pressure control subroutine 360, assuming the control point is within the boundaries set by gas flows and exhaust capacity. The former method may result in quicker chamber pressure changes, as the measurements, comparisons and calculations associated with the latter method are not invoked. The former method may be desirable where precise control of the chamber pressure is not required, whereas the latter method may be desirable where an accurate, repeatable, and stable pressure is desired, such as during the deposition of a film layer.

When pressure control subroutine 360 is invoked, the desired or target pressure level is received as a parameter from chamber manager subroutine 330A. Pressure control subroutine 360 operates to measure the pressure in chamber 13 by reading one or more conventional pressure manometers connected to the chamber, compare the measure value (s) to the target pressure, obtain proportional, integral and differential (PID) values from a stored pressure table corresponding to the target pressure, and adjust throttle valve 26 according to the PID values obtained from the pressure table. Alternatively, pressure control subroutine 360 may open or close throttle valve 26 to a particular opening size to regulate the pressure in chamber 13 to a desired pressure or pressure range.

Plasma control subroutine 370 comprises program code for controlling the frequency and power output setting of RF generators 31A and 31B and for tuning matching networks 32A and 32B. Plasma control subroutine 370, like the previously described chamber component subroutines, is invoked by chamber manager subroutine 330A.

The Deposition Process

The present invention will now be described with reference to a preferred process sequence practiced using the above described processing system. The hydrocarbon gas which may be used in the present invention may be any hydrocarbon compound in a gaseous form that is able to form a plasma at the reaction conditions employed by the present invention. The preferred hydrocarbon gas for use in the present invention is methane ($CH_4$). However, the present invention contemplates using other single hydrocarbon gases, such as $C_2H_6$ and $C_2H_2$, as well as a mixture of hydrocarbon gases, for example a mixture of acetylene and methane ($C_2H_2/CH_4$). The present invention contemplates using hydrocarbons in gas and other forms from the alkene group, the alkane group and the alkyne group. Examples of these hydrocarbons include $CH_4$, $C_2H_2$, $C_2H_4$, $C_2H_6$ and $C_3H_8$.

To form the amorphous carbon film according to the invention, the hydrocarbon gas is introduced into the chamber along with a carrier gas such as argon. Preferably, the hydrocarbon gas is introduced into the chamber through the first set of gas nozzles 39 at a flow rate of between about 10 sccm and about 500 sccm, and the carrier gas is introduced into the chamber through the second set of gas nozzles 40 at a flow rate of between about 5 sccm and about 300 sccm. In one preferred embodiment, the hydrocarbon gas is introduced into the chamber at a flow rate of about 125 sccm, and the argon gas is introduced into the chamber at a flow rate of about 27 sccm. The preferred ratio of the flow rate of the hydrocarbon gas to the flow rate of the carrier gas is between about 2:1 and about 5:1. Although the hydrocarbon gas and the carrier gas are preferably introduced into the chamber through separate gas nozzles, the invention also contemplates combining or premixing the hydrocarbon gas and the carrier gas before introducing them into the chamber.

Preferably, the chamber pressure during processing is maintained between about 10 mTorr and about 100 mTorr, and even more preferably, at about 20 mTorr. The source plasma power applied to the chamber to generate and maintain a plasma of the processing gas, including both the hydrocarbon gas and the carrier gas, is preferably an RF power at about 2 MHz and at less than 2000W, even more preferably, at about 1000W, for a 200 mm substrate. The power applied is adjusted according to size of the substrate being processed. Preferably, the substrate is maintained at between about 300° C. and about 430° C. during the deposition process, and the backside of the substrate is cooled by the helium gas in channels within the electrostatic chuck. Preferably, the substrate bias power is inactivated during the deposition process. After the deposition process, the substrate is preferably transferred into an anneal chamber without breaking vacuum, and an anneal step is conducted in the anneal chamber at a temperature between about 300° C. and about 430° C. for between about 30 minutes and about 90 minutes in a vacuum or in an inert gas environment. In one embodiment, the deposited substrate is annealed in a nitrogen environment for about 30 minutes.

Example

The experiment was conducted using an Ultima™ HDP-CVD reactor available from Applied Materials, Inc. of Santa Clara, Calif. The substrate is a 200 mm substrate typically used in the semiconductor/integrated circuit production. The hydrocarbon gas, methane ($CH_4$), is introduced into the chamber at a flow rate of about 125 sccm while the argon gas is introduced into the chamber at a flow rate of about 27 sccm. The chamber pressure during processing is maintained at about 15 mTorr. The source RF frequency for the source plasma generator was about 2.0 MHz while the bias plasma generator was inactivated during the deposition process. The source RF power applied to the chamber to generate and maintain the plasma was about 1000W. During processing, the substrate was maintained at a temperature of about 400° C. A low dielectric constant amorphous carbon film was deposited by the reaction of methane under HDP- CVD plasma conditions. A low dielectric constant amorphous carbon film of about 5200 Å thick was deposited using the above processing conditions. The substrate is then annealed in a nitrogen environment within the same chamber at about 400° C. for about 30 minutes. The low dielectric constant amorphous carbon film has a thickness of about 4770 Å after the anneal.

Table I and Table II list the depth profiles and the atomic concentrations of hydrogen, carbon, oxygen and silicon of the deposited film over the substrate before and after the anneal step, respectively. As shown in Table I, the low dielectric constant amorphous carbon film has a density of 1.23E23 atoms/cc with a hydrogen content ranging from 61.0% to 63.0% and a carbon content ranging from 37.0% to 39.0%. The surface of the film prior to anneal also includes oxygen content of 1.0% at a depth less than 700 Å. After the anneal, as shown in Table II, the low dielectric constant amorphous carbon film has a density of 1.25E23 atoms/cc with a hydrogen content ranging from 69.5% to 70.0% and a carbon content ranging from 30.0% to 30.5%. The oxygen content is eliminated by the anneal step. Also, after the anneal, the resulting thickness of the low dielectric constant amorphous carbon film is reduced to 4770 Å. The dielectric constant of the resulting film is about 2.53, and the film is thermally stable at a temperature of about 400° C.

TABLE I

Depth Profile/Atomic Concentration Before Anneal

| Depth | Atomic Concentration | | | | Density |
|---|---|---|---|---|---|
| (Angstroms) | Hydrogen | Carbon | Oxygen | Silicon | (at/cc) |
| <700 | 61.0 | 38.0 | 1.0 | n/a | 1.23E23 |
| 700–2950 | 61.0 | 39.0 | n/a | n/a | 1.23E23 |
| 2950–5200 | 63.0 | 37.0 | n/a | n/a | 1.23E23 |
| >5200 | n/a | n/a | n/a | 100 | 5.00E23 |

TABLE II

Depth Profile/Atomic Concentration After Anneal

| Depth | Atomic Concentration | | | | Density |
|---|---|---|---|---|---|
| (Angstroms) | Hydrogen | Carbon | Oxygen | Silicon | (at/cc) |
| <2390 | 69.5 | 30.5 | n/a | n/a | 1.25E23 |
| 2390–4770 | 70.0 | 30.0 | n/a | n/a | 1.25E23 |
| >4770 | n/a | n/a | n/a | 100 | 5.00E23 |

Figure 2:
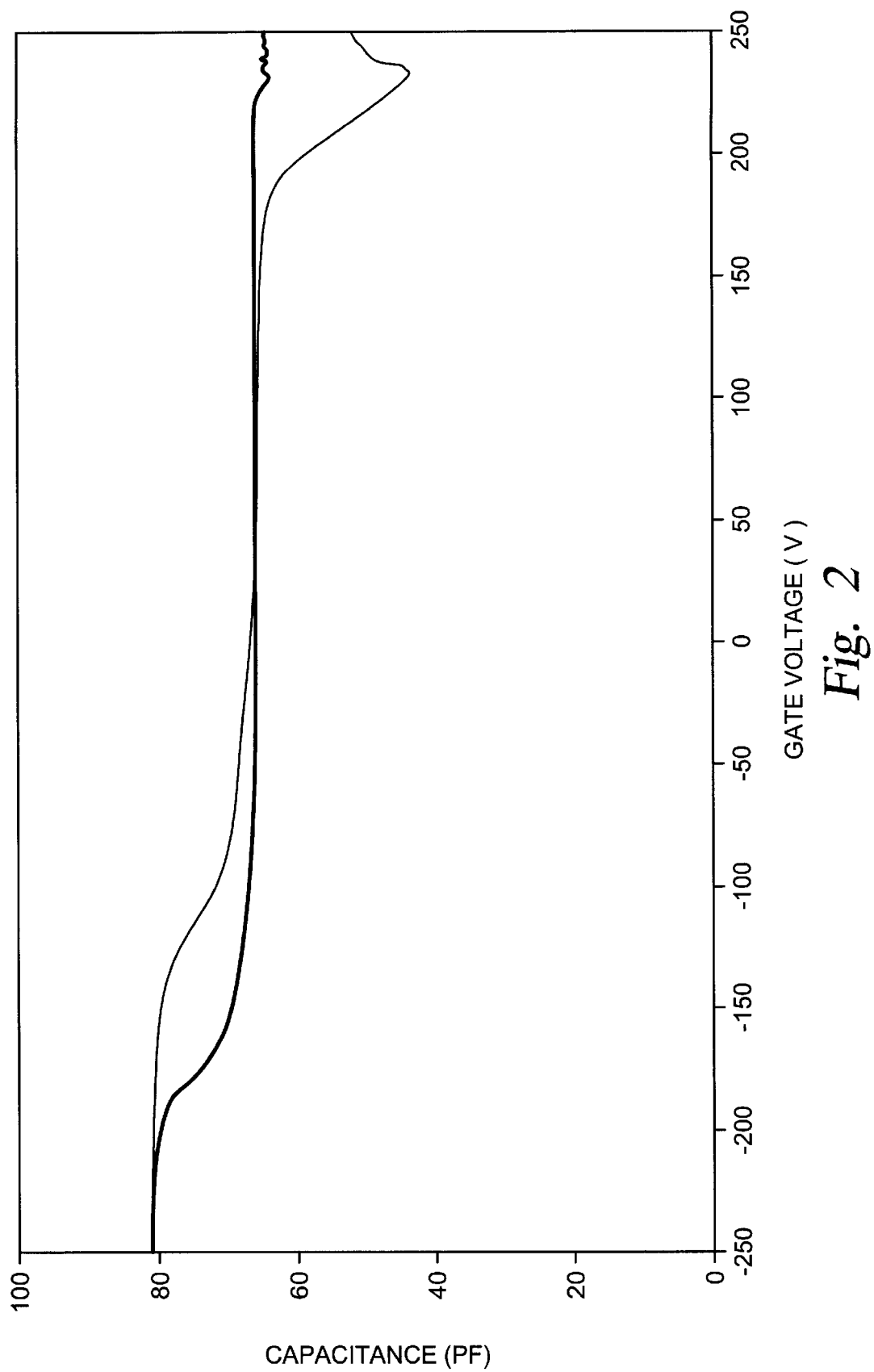
FIG. 2 is a hysteresis loop plot showing the capacitance-voltage (CV) measurement of a film deposited according to the invention.

FIG. 2 is a hysteresis loop plot showing the capacitance-voltage (CV) measurement of a film deposited according to the invention. FIG. 2 shows the capacitance in picofarads (pF) for the film with the gate voltage applied between −250V and 250V. The thickness of the sample film measures 0.6601 μm while the capacitance measures 80.8 pF. The dielectric constant or k value is determined using the thickness of the film and the measured capacitance according to the following equation:

$$k = \frac{Cd(1.129)}{23.8} \quad \text{Equation 1}$$

where C is the measured capacitance in picofarads (pF) and d is the thickness of the film in microns (μm). Using this equation, the value of k for the film as shown in FIG. 2 is determined to be about 2.53.

Figure 3:
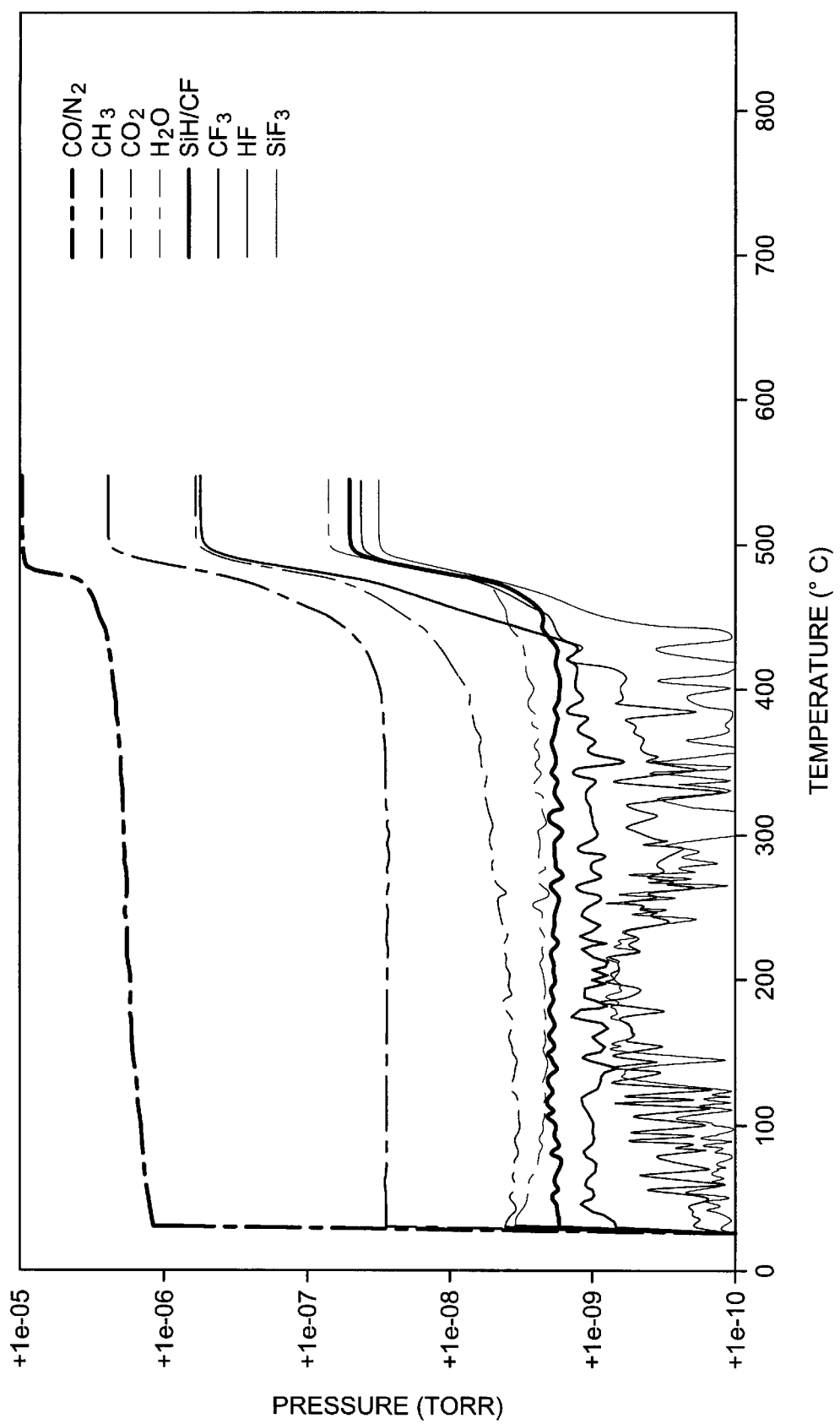
FIG. 3 is a graph showing the thermal stability of a hydrogenated amorphous carbon film deposited according to the invention.

FIG. 3 is a graph showing the thermal stability of an amorphous carbon film deposited according to the invention. The graph shows the pressure measurements of eight different categories of gases as the deposited film is heated in an anneal chamber from room temperature to about 600° C. to demonstrate the film's thermal stability. Thermal stability is represented by generally slight variations in the measured pressures for each category of gases while thermal instability of the film is indicated by sharp, significant rises (in logarithmic scale) in the chamber pressure that corresponds to breakdown and release of the category of gases into the chamber. In FIG. 3, the horizontal axis indicates the temperature of the film from 0° C. to 600° C., while the vertical axis indicates the pressure of different categories of gases in the chamber in logarithmic scale from $1\times10^{-10}$ Torr to $1\times10^{-5}$ Torr. The gases measured include $CH_3$, $H_2O$, HF, CO, $N_2$, SiH, CF, $CO_2$, $CF_3$ and $SiF_3$. As shown in FIG. 3, the film is thermally stable to at least about 400° C., as indicated by generally slight variations in the measured pressures. At temperatures greater than about 450° C., most of the gases begin to desorb from the film, as indicated by the sharp rises in the pressure in the chamber, and the film becomes thermally unstable.

Anti-Reflective Coating Application

The inventors have discovered that a film formed according to the invention is also useful as an anti-reflective coating (ARC) to provide low reflectance to UV light used in patterning sub-micron interconnect features, particularly for the 193 nm and 248 nm UV wavelengths. In the process of forming interconnect structures in a dielectric layer on a substrate, the ARC film is deposited over the dielectric layer, and a photoresist is applied over the ARC film. The photoresist is then patterned using a UV light source, and the etching process is carried out to form the structures in the dielectric layer. As compared to currently practiced ARC films, the ARC film according to the invention provides more precisely defined patterns on the photoresist because the ARC film according to the invention provides a lower reflectance to UV wavelengths of about 193 nm and about 248 nm. Because of the lower reflectance, the patterns on the photoresist are less distorted by the reflected UV radiation, resulting in sharper, more precisely defined patterns on the photoresist.

Figure 4A:
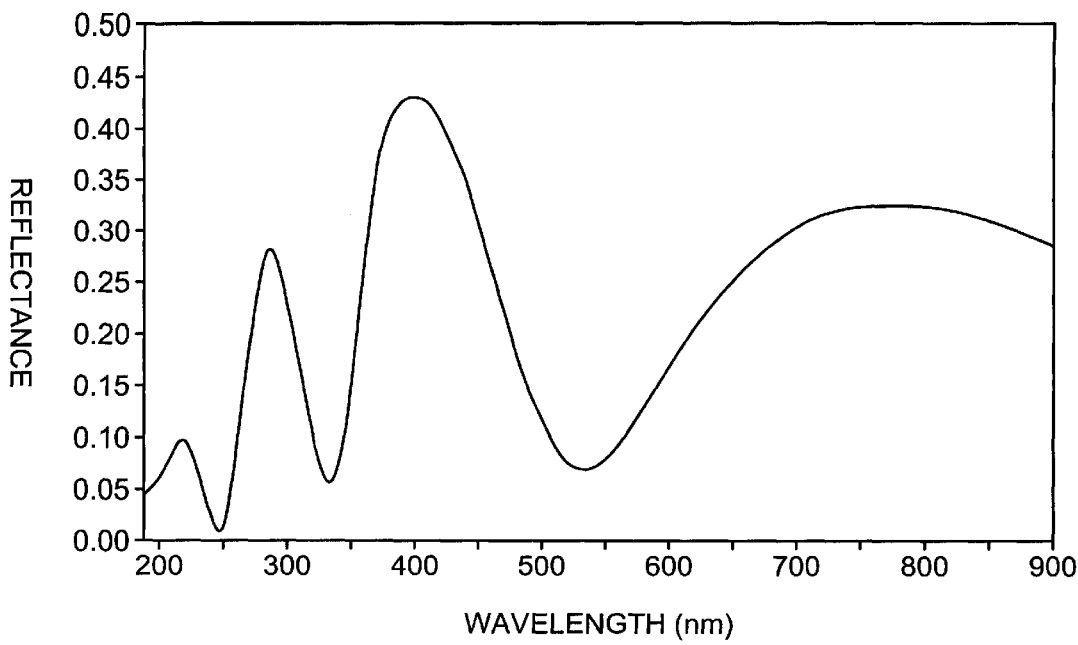
FIGS. 4a and 4b are graphs showing the reflectance of films deposited according to the invention used as anti-reflective coatings.
Figure 4B:
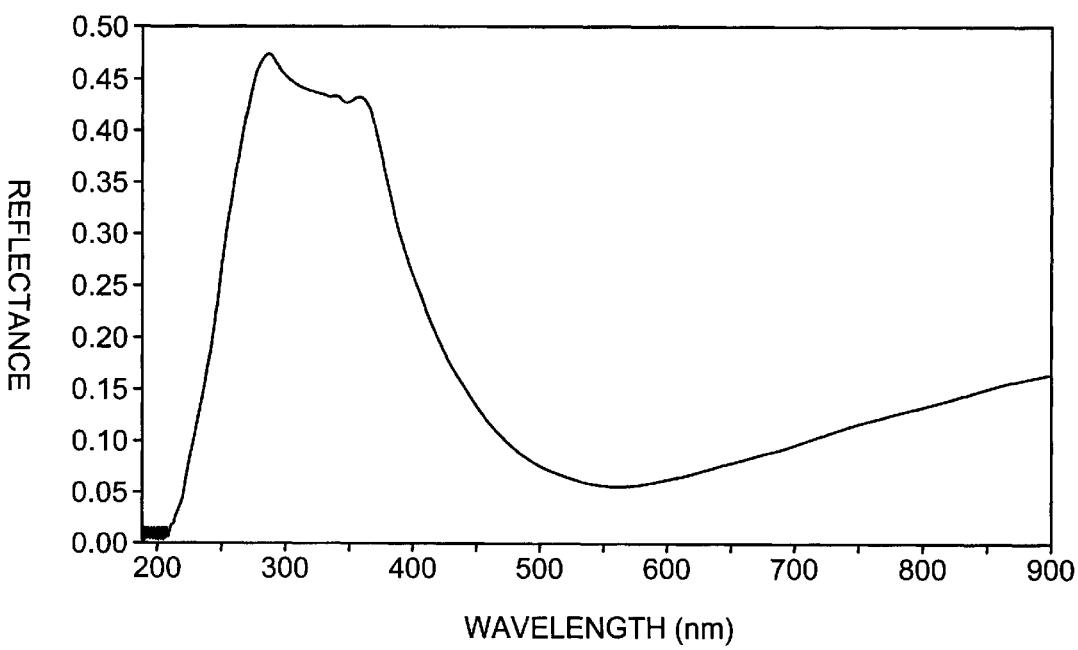

FIGS. 4a and 4b are graphs showing the reflectance of films deposited according to the invention used as anti-reflective coatings. The reflectance of the films represents a value as compared to the reflectance of bare silicon (i.e., reflectance of bare silicon equals one). The amorphous carbon film according to the invention provides low reflectance particularly for the 193 nm and 248 nm UV wavelengths that are used for patterning photoresist. The reflectance of the films deposited according to the invention varies with the wavelength of the radiation as well as the thickness of the films. The film measured in FIG. 4a has a film thickness of about 2561 Å while the film measured in FIG. 4b has a film thickness of about 859 Å. As shown in FIG. 4a, the reflectance of the film (2561 Å thickness) is about 0.046 at wavelength of about 193 nm, about 0.005 at wavelength of about 248 nm, about 0.315 at wavelength of about 365 nm, and about 0.223 at wavelength of about 633 nm. As shown in FIG. 4b, the reflectance of the film (859 Å thickness) is about 0.005 at wavelength of about 193 nm, about 0.228 at wavelength of about 248 nm, about 0.430 at wavelength of about 365 nm, and about 0.070 at wavelength of about 633 nm. Compared to currently practiced ARC films, the amorphous carbon film according to the invention provides significantly lower reflectance at these UV wavelengths. Both the composition and the thickness of the amorphous carbon film according to the invention can be adjusted to meet the reflectance demands of the photoresist patterning process for sub-micron structures.

The ARC application described above is only representative of one use for the amorphous carbon film according to the invention. The inventors also contemplate applications of the invention in other substrate processing.

While the foregoing is directed to the preferred embodiment of the present invention, other and further embodiments of the invention may be devised without departing from the basic scope thereof. The scope of the invention is determined by the claims which follow.

What is claimed is:

1. A method for forming an anti-reflective coating on a substrate, comprising:
   a) positioning the substrate in a high density plasma chemical vapor deposition chamber;
   b) introducing a processing gas comprising a hydrocarbon gas and a carrier gas into the chamber, wherein the hydrocarbon gas is selected from the group consisting of alkene hydrocarbons, alkane hydrocarbons, alkyne hydrocarbons, and combinations thereof;
   c) generating a high density plasma of the processing gas;
   d) depositing an amorphous carbon film on the substrate while maintaining the substrate at a temperature of about 300° C. to 400° C.; and
   e) annealing the amorphous carbon film after deposition, wherein the amorphous carbon film is deposited on a dielectric layer of a substrate, a photoresistive layer is applied to the amorphous carbon film, and the dielectric layer is etched to form an interconnect structure.

2. The method of claim 1, further comprising:
   maintaining chamber pressure between about 10 mTorr and about 100 mTorr.

3. The method of claim 2, wherein the chamber pressure is maintained at about 20 mTorr.

4. The method of claim 1, wherein the hydrocarbon gas is introduced between about 10 sccm and about 500 sccm and the carrier gas is introduced between about 5 sccm and about 300 sccm.

5. The method of claim 1, wherein the hydrocarbon gas is introduced at about 125 sccm and the carrier gas is introduced at about 27 sccm.

6. The method of claim 1, wherein the hydrocarbon gas and the carrier gas are introduced at a ratio of hydrocarbon:carrier gas between about 2:1 and about 5:1.

7. The method of claim 1, wherein the plasma is generated by applying an RF power at between about 1000W and about 2000W.

8. The method of claim 1, wherein the plasma is generated by applying an RF power at about 2 MHz to the chamber at about 1000W.

9. The method of claim 1, wherein the hydrocarbon gas comprises methane.

10. The method of claim 1, wherein the hydrocarbon gas comprises a gas selected from the group consisting of $CH_4$, $C_2H_2$, $C_2H_4$, $C_2H_6$, $C_3H_8$, and combinations thereof.

11. The method of claim 1, wherein the carrier gas comprises argon.

* * * * *